United States Patent [19]
Lee et al.

[11] Patent Number: 5,506,450
[45] Date of Patent: Apr. 9, 1996

[54] SEMICONDUCTOR DEVICE WITH IMPROVED ELECTROMIGRATION RESISTANCE AND METHOD FOR MAKING THE SAME

[75] Inventors: Chii-Chang Lee; Hisao Kawasaki, both of Austin, Tex.

[73] Assignee: Motorola, Inc., Schaumburg, Ill.

[21] Appl. No.: 435,107

[22] Filed: May 4, 1995

[51] Int. Cl.$^6$ .............................. H01L 23/48; H01L 21/20
[52] U.S. Cl. ......................... 257/767; 257/773; 257/775; 257/776; 257/758; 437/180
[58] Field of Search ................................... 257/767, 773, 257/775, 776, 758, 763; 437/180, 192

[56] References Cited

U.S. PATENT DOCUMENTS

| | | | |
|---|---|---|---|
| 5,126,819 | 6/1992 | Abe et al. | 257/775 |
| 5,288,948 | 2/1994 | Fukuda et al. | 257/775 |
| 5,461,260 | 10/1995 | Varker et al. | 257/767 |
| 5,463,255 | 10/1995 | Isono | 257/758 |

OTHER PUBLICATIONS

S. M. Sze, ed.; "VLSI Technology;" McGraw–Hill, New York; pp. 369–371 (1983).

*Primary Examiner*—Mark V. Prenty
*Attorney, Agent, or Firm*—Patricia S. Goddard

[57] ABSTRACT

Semiconductor devices having improved electromigration resistance in their connections through dielectric layers are described. Where a conductive metal line overlies a dielectric layer and makes contact to a lower conductive structure through the dielectric layer by virtue of a conductive member, such as a tungsten plug or metal contact, the conductive metal line is provided with an end portion not otherwise connected to a conductive structure. The end portion serves as a reservoir of extra conductive material supplying the conductive metal line as the line is depleted through stress migration and/or electromigration.

26 Claims, 4 Drawing Sheets

5,506,450

SEMICONDUCTOR DEVICE WITH IMPROVED ELECTROMIGRATION RESISTANCE AND METHOD FOR MAKING THE SAME

FIELD OF THE INVENTION

The present invention relates generally to a layout for a semiconductor device, and more specifically to the layout of metal lines subject to stress migration and/or electromigration.

BACKGROUND OF THE INVENTION

FIGS. 1 and 2, which show a plan layout and cross-sectional view, respectively, illustrate a conventional way to lay out a connection device 10 on a semiconductor substrate 12 having a dielectric layer 14 overlying the substrate 12 through which a via 16 is formed to facilitate electrical connection with conductive line 18 on substrate 12. Via 16 is filled with a conductive member 20, which may be understood to be a conductive plug, e.g. of tungsten, to which metal line 22, e.g. of aluminum, is connected.

FIG. 2 is a cross-section of the connection device 10 layout of FIG. 1 taken at line 2—2 in FIG. 1 illustrating the connection device 10 from the side. In the finished semiconductor device, there are additional dielectric and passivation layers provided over the connection device 10 and metal line 22 to seal and protect them.

Due to the confinement of metal lines by dielectric layers and the difference in thermal expansion coefficients, the metal lines in semiconductor devices are under high thermal stress. This stress will tend to drive the vacancies or holes out of the metal interior to coalesce at the end of the metal line to minimize the strain energy.

Further, because of repeated flow of electrons in a metal line predominantly in one direction, there is repeated electromigration of the metal atoms in the direction of the predominant current flow. S. M. Sze, ed., VLSI Technology, McGraw-Hill, New York, 1983, pp. 369–371, indicates that "[a] prime consideration in device reliability is the electromigration resistance of the metallization. Electromigration is observed as a material transport of the conductive material. It occurs by the transfer of momentum from the electrons, moving under the influence of the electric field applied along the conductor, to the positive metal ions. Hence, after a conductor failure, a void or break in the conductor is observed and a nearby hillock or other evidence of material accumulation in the direction of the anode [Figure references omitted.] is found."

On page 370, Sze shows several SEM micrographs of breaks in metal lines. Techniques to increase electromigration resistance of aluminum film conductors include alloying with copper, incorporation of discrete layers such as titanium, encapsulating the conductor in a dielectric or incorporating oxygen during film deposition as reported by Sze. The medium-time-to-failure (MTF) of the conductor also seems to be related to the grain size in the metal film; distribution of grain size; the degree to which the conductor exhibits fiber texture, i.e. in the <111>direction; method of film deposition and line width, according to Sze.

FIG. 3 is a cross-section of the connection device 10 of FIG. 2 after it has been subjected to numerous thermal cycles and predominantly unidirectional current where it is seen that metal line 22 has pulled away from conductive member 20 to create a break or open in connection device 10. There are prior art structures that use more than one member 20 to connect metal line 22 with conductive line 18, but such a structure is for the purpose of handling the current density. Thus, if the metal line 22 retracts from one of the conductive members 20 and is still in connection with remaining conductive members 20, the remaining conductive members 20 may be insufficiently large to handle the current density. The stress migration and electromigration phenomena thus accelerate to create an open. Thus, there is a high potential to have voids formed at the end of a line, especially if the line carries appreciable current or is relatively long. These problems are more serious for devices stressed at high temperatures and/or high current densities.

It would be helpful if other straightforward methods were discovered which reduces electromigration and increases MTF for metal conductors.

BRIEF DESCRIPTION OF THE DRAWINGS

The present invention is illustrated by way of example and not limitation in the figures of the accompanying drawing, in which like references indicate similar elements, and in which.

DETAILED DESCRIPTION OF A PREFERRED EMBODIMENT

Generally, the present invention, in one embodiment, is a semiconductor device where a dielectric layer overlies a semiconductor substrate and has an opening formed therein. A conductive member is formed in the opening of the dielectric layer. Such conductive members are often referred to as plugs, and in one non-limiting embodiment may be a tungsten plug. However, the conductive member may also be a contact to a conductive, doped substrate region. A conductive line is also formed on the dielectric layer covering, and is in electrical contact with the conductive member. The conductive line has a runner width and has an end portion having the runner width. The end portion of the conductive line extends a length at least twice the runner width beyond the center of the conductive member, without being physically connected to another conductive member and without electrical current passing through the end portion. The conductive line, in one non-limiting embodiment, may be a metal line, e.g. aluminum or copper.

Figure 4:
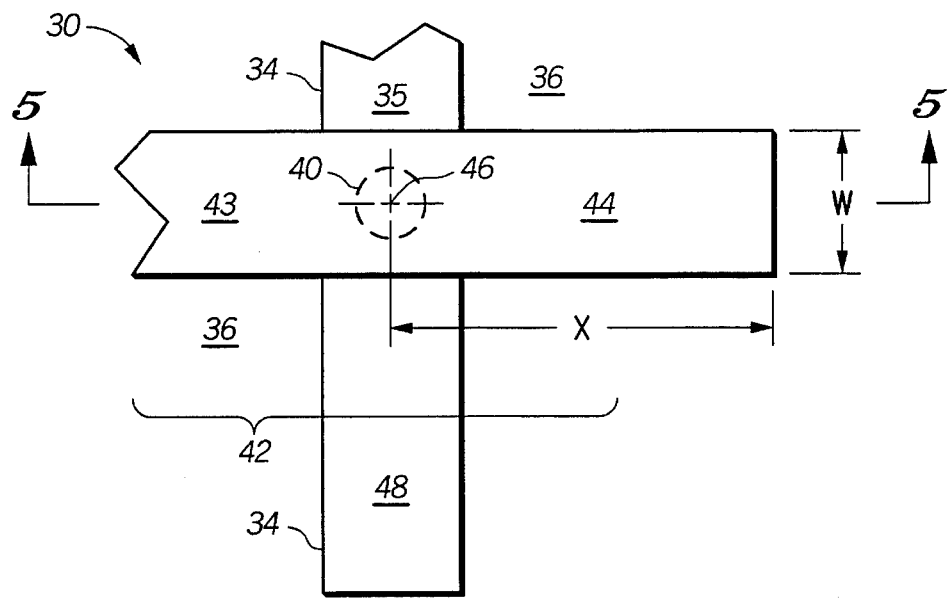
FIG. 4 is a plan view of a lay out of a connection device on a semiconductor substrate according to one embodiment of the invention.
Figure 5:
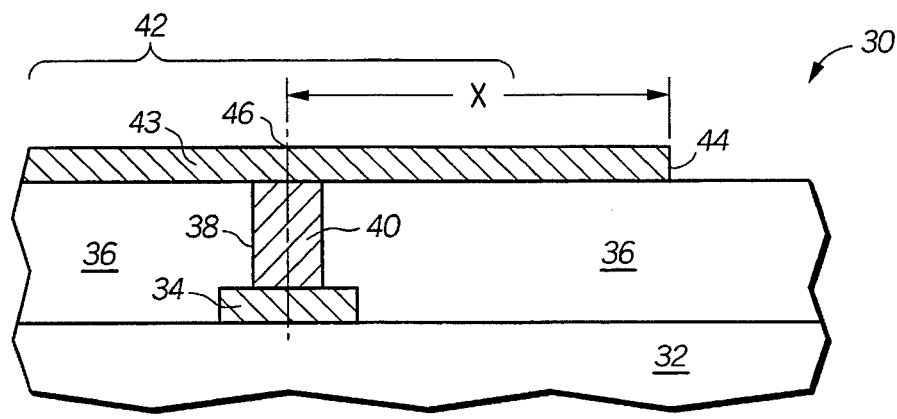
FIG. 5 is a cross-section view of the inventive lay out of the connection device of FIG. 4 taken along line 5—5 of FIG. 4.

The above-described embodiment of the invention is illustrated in FIGS. 4 and 5, which show a plan layout and cross-sectional view, respectively, of a connection device 30 on a semiconductor substrate 32 which bears a conductive structure 34 formed thereon through conventional processing such as deposition, photolithographic patterning and etching. Semiconductor substrate 32 has a dielectric layer 36 formed thereon, through which an opening 38 (also called a via) is formed, such as by conventional etching, in a non-limiting example. A conductive member 40 (also sometimes called a plug) is formed in and fills the opening 38, e.g. by filling with a material and etching or polishing back. It will be understood that this invention applies to contacts to semiconductive substrate regions as well as plugs. A conductive metal line 42 is then formed on top of the dielectric layer 36, again by conventional deposition and patterning techniques, in such a way as to be in electrical and physical contact with the conductive member 40. As formed in accordance with the present invention, conductive metal line 42 has a runner portion 43 having a width w and conductive metal line 42 further has an end portion 44 which extends at least 2 µm beyond a center 46 of the conductive member 40. End portion 44 is not otherwise physically connected to another conductive member 40, conductive metal line 42 or conductive structure 34. It will be appreciated that in actual devices, runner portion 43 will be much longer than illustrated in FIGS. 4–8, where it is truncated for illustrative purposes. Further, width w will be understood to be a uniform width when greater than 50% of the runner portion 43 has that width.

Figure 1:
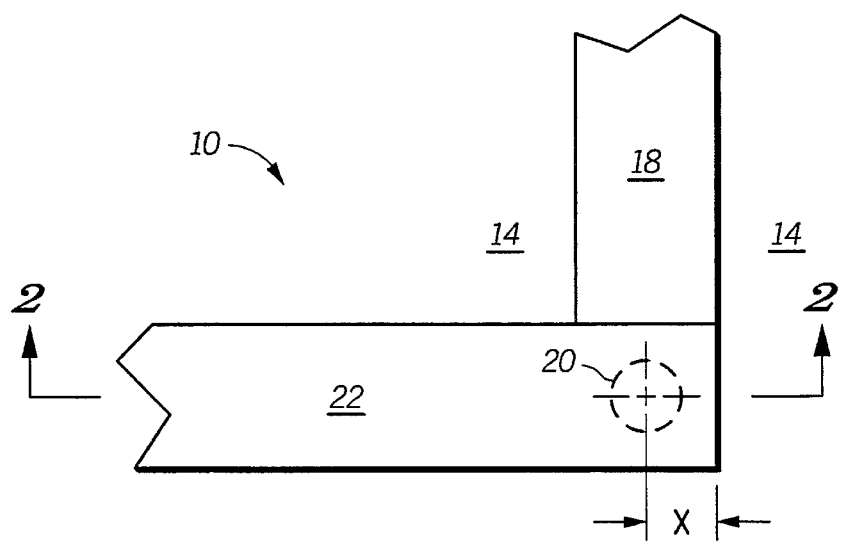
FIG. 1 is a plan view of a conventional lay out of a connection device on a semiconductor substrate.
Figure 2:
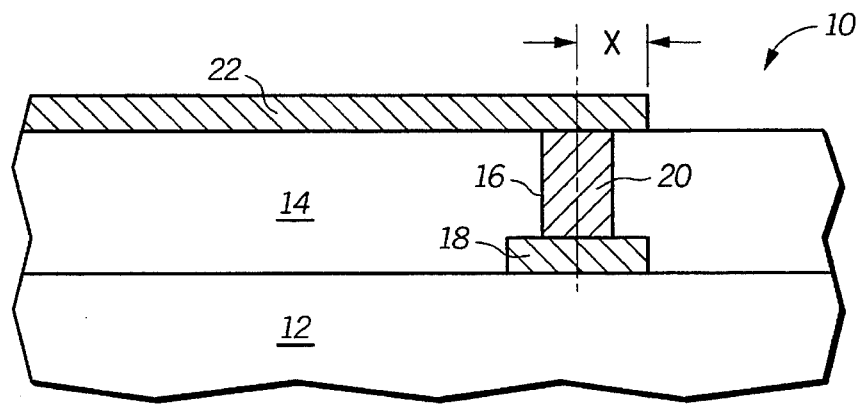
FIG. 2 is a cross-section view of the conventional lay out of the connection device of FIG. 1 taken along line 2—2 of FIG. 1.
Figure 3:
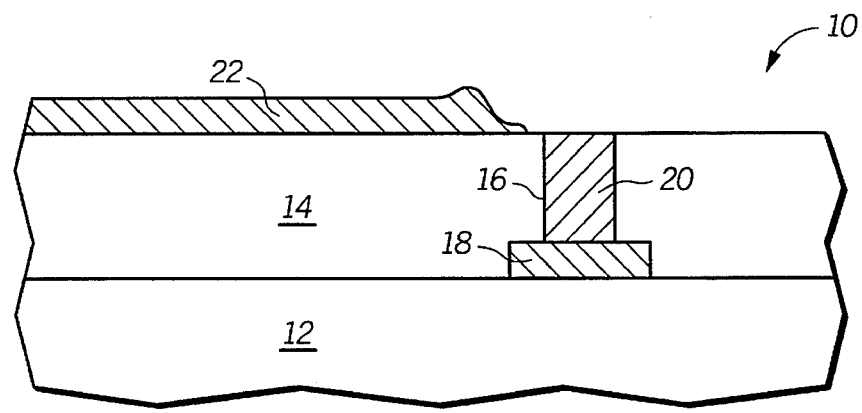
FIG. 3 is a cross-section of the connection device of FIG. 2 after it has been subjected to numerous thermal cycles and/or unidirectional current to create an open.

The function of end portion 44 is to serve as a reservoir of excess conductive metal line 42 material to be used during the inevitable processes of stress migration and/or electromigration to insure the integrity of connection device 30 and avoid opens or breaks in connection device 30. In a conventional connection device 10 such as that seen in FIG. 1, there is no end portion 44 or equivalent to serve as a reservoir, and the distance x from the center of the conductive member 20 to the end of metal line 22 is typically much less than 1 µm on a typical ULSI device, and is normally only enough to ensure connection of metal line 22 with conductive member 20 within the photolithographic limitations of the design rules. Typically, values for x on ULSI devices are around 0.5 to 0.6 µm. As discussed above, such a connection device 10 is subject to breakage and opens due to the movement of material in metal line 22 due to stress migration and/or electromigration. End portion 44 of FIGS. 4 and 5 provides a supply of material to the conductive metal line 42. To provide this reservoir of material, in one embodiment it is preferred that end portion 44 extends at least twice as long as the width w of conductive metal line 42, beyond the center 46 of conductive member 40. In another embodiment, end portion 44 extends at least 2 µm beyond the center 46; i.e. $x \geq 2$ gm. In another embodiment of the invention, it is preferred that $x > 3$ µm, and may range up to 5 or 6 µm or higher, such as 10 µm or more. In the particular embodiment illustrated in FIGS. 4 and 5, end portion 44 has the same width w as conductive metal line 42, although as illustrated later this is not a requirement of the invention.

It will be appreciated that conductive member 40 may be made of tungsten or other suitable material, and that the sides of opening 38 may be lined with another, different material to aid in providing secure electrical connection. Such a layer may be understood as a conductive "glue" layer to adhere the tungsten plug and aluminum metal line together and to dielectric layer 36. Conductive structure 34 may have its own end portion 48 (distinct from its own runner portion 35) to ensure that connection device 30 remains intact from beneath conductive member 40 as well. Conductive structure 34 and conductive metal line 42 may be made out of the same or different conductive material, and may include, in non-limiting examples, aluminum and copper. As noted, conductive structure 34 may also be a conductive region in the substrate 32 such as a diffusion region, implant region or the like. Stress migration and electromigration are not of concern in this latter situation, and the teachings of this invention would not then apply to the underlying conductive structure 34.

In the manufacture of a device such as the inventive connection device 30 shown in FIGS. 4 and 5, the only modification necessary to conventional processing would be to ensure that the mask used to etch the conductive metal line (e.g. line 42) for which protection is desired has a suitable end portion 44. As will be shown, the exact geometry of such end portion is immaterial as long as it can serve the intended purpose of supplying additional conductive material to the conductive metal line. Thus, the geometry of the end portion may be altered to conveniently fit into available area in the semiconductor chip layout.

Figure 6:
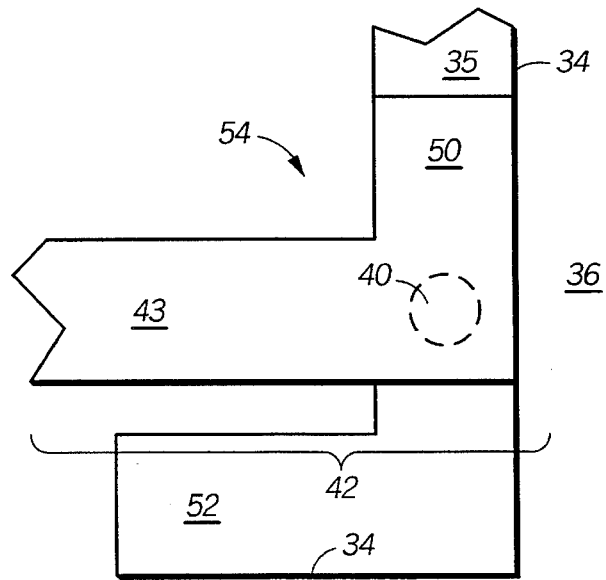
FIG. 6 is a plan view of a lay out of a connection device on a semiconductor substrate according to another embodiment of the invention using an L-shaped reservoir.
Figure 7:
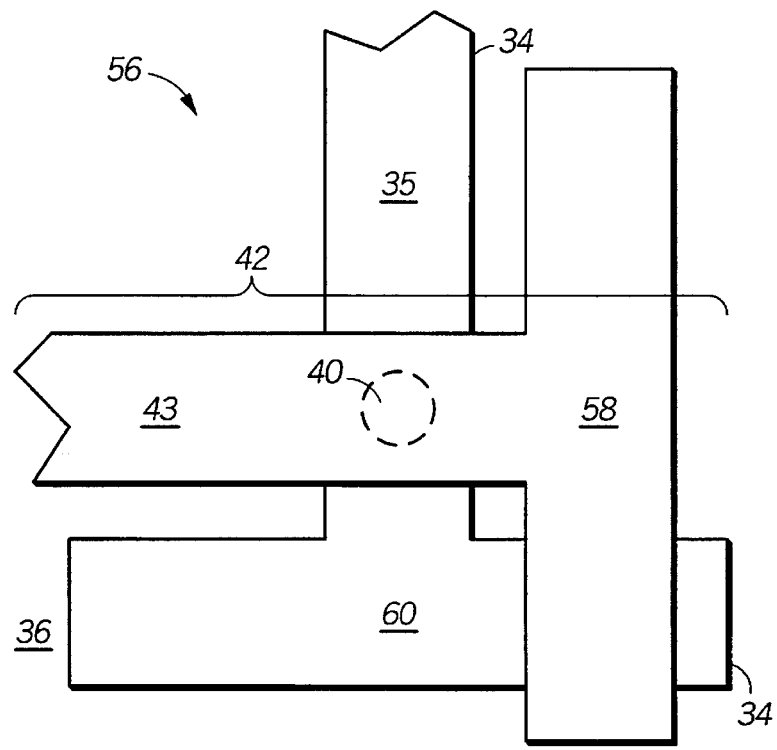
FIG. 7 is a plan view of a lay out of a connection device on a semiconductor substrate according to another embodiment of the invention using a T-shaped reservoir.

It is not necessary that end portion 44 be collinear with conductive metal line 42 as shown in FIGS. 4 and 5, as will be illustrated in FIGS. 6–7 where like reference numbers refer to like elements. In FIG. 6, showing a connection device 54, end portions 50 and 52 of conductive metal line 42 and conductive structure 34, respectively, are L-shaped in that they turn at a single right angle to the runner portion 43 and runner portion 35, respectively. End portion 50 immediately turns at conductive member 40 and overlays conductive structure 34 (with dielectric 36 intervening), whereas end portion 52 of conductive structure 34 is collinear therewith for a bit beyond conductive member 40 before making a 90° turn parallel to conductive metal line 42. Both end portions 50 and 52, which are perpendicular to their respective runner portions, are within the scope of this invention.

Shown in FIG. 7 is a connection device 56, which is an alternate embodiment of the invention where end portions 58 and 60 of conductive metal line 42 and conductive structure 34 form a T-shape with their corresponding runner portions 43 and 35, respectively (i.e. the end portions turn right angles in two directions off the runner portion). Such T-shaped end portions 58 and 60 may occur a little ways from conductive member 40, or may extend in two directions (opposite or otherwise) from conductive member 40, as long as they are available to supply extra material to conductive metal line 42 and conductive structure 34, respectively, during the phenomena of stress migration and electromigration.

Figure 8:
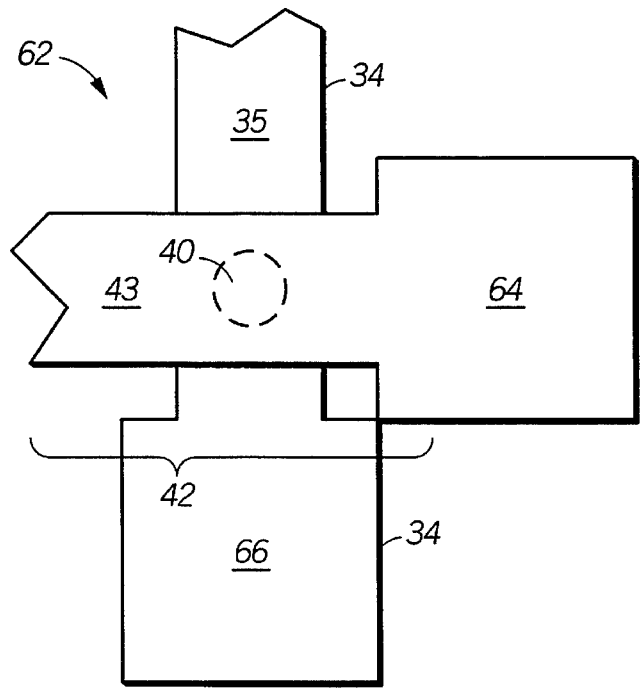
FIG. 8 is a plan view of a lay out of a connection device on a semiconductor substrate according to another embodiment of the invention using a square-shaped reservoir.

Shown in FIG. 8 is still another embodiment of the present invention which illustrates a connection device 62 where end portions 64 and 66 of conductive metal line 42 and conductive structure 34 are square regions. It will be appreciated that the exact shape of the end portions is immaterial as long as they provide an adequate reservoir of excess material for the lines or structures that might be affected by stress migration and/or electromigration. This can only be the case if such end portions are not otherwise physically connected to another conductive member, line or structure. Of course, end portions will be physically connected to other dielectric structures.

In one embodiment of the invention, there is a connection device area defined as the area of conductive metal line making electrical contact to the conductive member, which in FIGS. 4 and 6–8 is the same as the plan, cross-sectional area of conductive members 40. End portions have their own area, measured beyond the center of the conductive member, which area is preferably at least about 3 times as great as the connection device area. It is important that the end portion be of sufficient size and connected to only the conductive metal line so that additional physical material may be supplied to the line from the end portion when stress migration or electromigration of the material occurs. In another embodiment of the invention, end portion has an area at least 5 times as great that of the connection device area.

In still another embodiment of the invention, the amount of excess conductive material in the end portion may be specified relative to the uniform width w of the runner portion. For example, in a FIG. 4-type embodiment, the end portion may be designated as having an edge, for example, a side edge, with a length at least twice the uniform width, w. This relationship may be expressed as $x \geq 2w$. Alternatively, if the end portion is a square, as in a FIG. 8-type embodiment, the sides of the square may be defined as at least 2w.

Figure 9:
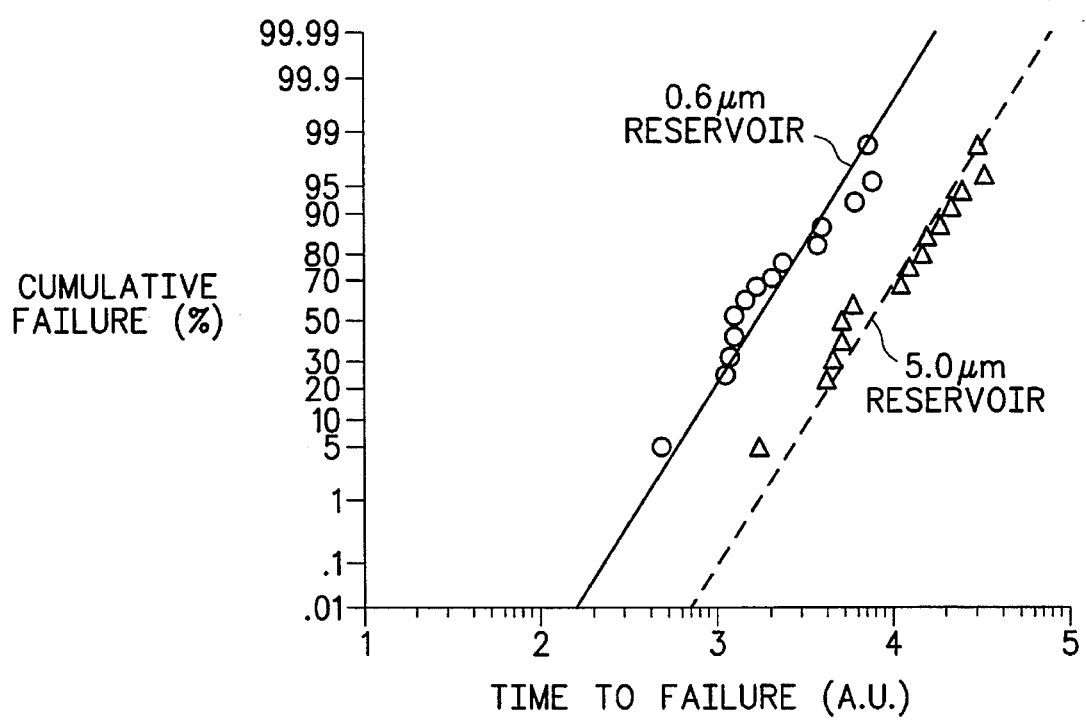
FIG. 9 is a failure distribution chart plotting the cumulative failures as a function of time, for conductive lines having a conventional lay out where x=0.6 µm and the inventive layout where x=5.0 µm to provide a reservoir.

FIG. 9 plots a comparison of the failure distribution results between splits of an inventive structure where end portion reservoirs are 5.0 μm long (x=5.0 μm) and a conventional structure where there is no end portion and x=0.6 μm. For the inventive structures where x=5.0 μm, a collinear structure such as that shown in FIGS. 4 and 5 was used. The devices were subjected to 7.2 mA of forced high DC current at about 200° C., with a current density of approximately $3\times10^6$ A/cm$^2$. It will be seen from FIG. 9 that while the total cumulative failures for each split were not significantly different, the time to failure for the case where end portions were present (x=5.0 μm) was appreciably longer for the inventive device. The term "a.u." in FIG. 9 stands for a proprietary "arbitrary unit" of time which remained the same throughout the experiment. Thus, it may be seen that the inventive structures do increase MTF.

The foregoing description and illustrations contained herein demonstrate many of the advantages associated with the present invention. It was recently found that when baking devices at 400° C. for 24 hours without electrical current stressing that large voids formed at the end of metal lines and thus caused reliability problems. This invention will address this problem. In particular, it has been revealed that the invention improves product reliability and gives larger allowance for semiconductor dies to be shrunk further.

The method of the invention may be used to permit higher current density to be passed through a particular size of interconnect; or the inventive structure could be used to increase the reliability of the connection; or both. Roughly, the increased current density the connection device could handle is proportional to the length of the end portion. Similarly, the increased reliability of the connection device is proportional to the length of the end portion.

Thus it is apparent that there has been provided, in accordance with the invention, a connection device layout that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, an end portion or reservoir of different geometric configuration than those shown may be easily implemented. In addition, the invention is not limited to the number of reservoirs that could be connected to a particular connection device. For example, the T-shaped end portions may be understood as illustrative of two end portions or reservoirs per connection device. It is also important to note that the present invention is not limited in any way to particular materials and can be useful for any material subject to stress migration or electromigration. It is noted that as illustrated in FIGS. 4–8, both conductive layers (conductive structure 34 and conductive metal line 42) have end portions or reservoirs. It will be understood that such an arrangement is not necessary. The structure and method of this invention which utilize conductive structure having an end portion or reservoir may be practiced at only one or at multiple conductive layers, and at any level in a semiconductor device. Therefore, it is intended that this invention encompass all such variations and modifications as fall within the scope of the appended claims.

We claim:

1. A semiconductor device comprising:
    a semiconductor substrate;
    a dielectric layer overlying the semiconductor substrate and having an opening formed therein;
    a conductive member formed in the opening of the dielectric layer; and
    a conductive metal line formed on the dielectric layer covering, and in electrical contact with the conductive member, wherein the conductive metal line has a runner width and has an end portion having the runner width, and wherein the end portion of the conductive metal line extends a length at least twice the runner width, beyond a center of the conductive member, without being physically connected to another conductive member.

2. The semiconductor device of claim 1 wherein the conductive member is comprised of tungsten.

3. The semiconductor device of claim 2 wherein the conductive metal line is comprised of aluminum.

4. The semiconductor device of claim 1 wherein the end portion is perpendicular to that portion of the conductive metal line in electrical contact with the conductive member.

5. The semiconductor device of claim 1 wherein the end portion is collinear with that portion of the conductive metal line in electrical contact with the conductive member.

6. The semiconductor device of claim 1 wherein the end portion of the conductive metal line extends at least 2 μm beyond the center of the conductive member.

7. A semiconductor device comprising:
    a semiconductor substrate;
    a dielectric layer overlying the semiconductor substrate and having an opening formed therein;
    a conductive member formed in the opening of the dielectric layer; and
    a conductive metal line formed on the dielectric layer and in electrical contact with the conductive member, wherein the conductive metal line has a runner portion and an end portion, wherein the runner portion includes a connection device area defined as the area of the conductive metal line making electrical contact to the conductive member, and wherein the end portion
    is immediately adjacent the connection device area,
    has an area at least 3 times as great as the connection device area, and without being physically connected to another conductive member.

8. The semiconductor device of claim 7 wherein the conductive member is comprised of tungsten.

9. The semiconductor device of claim 8 wherein the conductive metal line is comprised of aluminum.

10. The semiconductor device of claim 7 wherein the end portion is shaped as a square.

11. The semiconductor device of claim 7 wherein at least part of the end portion is perpendicular to the runner portion.

12. The semiconductor device of claim 7 wherein the end portion and runner portion together form a "T" shape.

13. The semiconductor device of claim 7 wherein the end portion has an area at least 5 times as great as the connection device area.

14. A semiconductor device comprising:
 a semiconductor substrate having a conductive structure;
 a dielectric layer overlying the semiconductor substrate;
 a conductive member formed in the dielectric layer and in electrical contact with the conductive structure; and
 a conductive metal line overlying the dielectric layer and in electrical contact with the conductive member, the conductive metal line having a runner portion which is in electrical contact with the conductive member, and having an end portion, wherein the runner portion has a uniform width, and wherein the end portion has a width at least equal to the uniform width and has an edge with a length at least twice the uniform width, and wherein the end portion extends beyond a center of the conductive member without being physically connected to any conductive element of the semiconductor device other than the conductive member.

15. The semiconductor device of claim 14 wherein the conductive member is comprised of tungsten.

16. The semiconductor device of claim 15 wherein the conductive metal line is comprised of aluminum.

17. The semiconductor device of claim 16 wherein the end portion has the uniform width.

18. The semiconductor device of claim 16 wherein at least a part of the end portion is perpendicular to the runner portion.

19. The semiconductor device of claim 14 wherein the edge has a length of at least 2 µm.

20. The semiconductor device of claim 14 wherein the end portion is shaped as a square wherein at least one edge of the square has the length of at least twice the uniform width.

21. A method of forming a semiconductor device comprising:
 providing a semiconductor substrate;
 forming a dielectric layer overlying the semiconductor substrate;
 forming an opening in the dielectric layer;
 forming a conductive member in the opening;
 forming a conductive metal line on the dielectric layer covering and in electrical contact with the conductive member, wherein the conductive metal line has a runner width and has an end portion having the runner width, and wherein the end portion of the conductive metal line extends a length at least twice the runner width beyond a center of the conductive member, without being physically connected to another conductive member.

22. The method of claim 21 wherein the conductive member is comprised of tungsten.

23. The method of claim 21 wherein the conductive metal line is comprised of aluminum.

24. The method of claim 21 wherein the end portion is perpendicular to that portion of the conductive metal line in electrical contact with the conductive member.

25. The method of claim 21 wherein the end portion is collinear with that portion of the conductive metal line in electrical contact with the conductive member.

26. The method of claim 21 wherein the end portion of the conductive metal line extends at least 2 µm beyond the center of the conductive member.

* * * * *